United States Patent [19]
Fischer et al.

[11] Patent Number: 5,773,083
[45] Date of Patent: Jun. 30, 1998

[54] METHOD FOR COATING A SUBSTRATE WITH A COATING SOLUTION

[75] Inventors: Frank W. Fischer, Mesa; Thomas W. Peterson, Tucson, both of Ariz.

[73] Assignee: Motorola, Inc., Schaumburg, Ill.

[21] Appl. No.: 950,605

[22] Filed: Oct. 15, 1997

Related U.S. Application Data

[63] Continuation of Ser. No. 693,468, Aug. 2, 1996, abandoned.

[51] Int. Cl.$^6$ .......................................................... B05D 3/12
[52] U.S. Cl. ......................... 427/240; 427/385.5; 427/231
[58] Field of Search ................................ 427/240, 385.5; 437/231

[56] References Cited

U.S. PATENT DOCUMENTS

| | | | |
|---|---|---|---|
| 4,748,053 | 5/1988 | Okada | 427/240 |
| 5,066,616 | 11/1991 | Gordon | 437/229 |
| 5,395,803 | 3/1995 | Adams | 437/229 |
| 5,405,813 | 4/1995 | Rodrigues | 437/231 |

*Primary Examiner*—Janyce Bell
*Attorney, Agent, or Firm*—Rennie William Dover

[57] ABSTRACT

A method for coating a substrate with a coating solution. In a first step (31), a semiconductor wafer is placed on a turntable. In a second step (32), the substrate is spun at a high speed and a coating solution is dispensed onto the substrate. In a third step (33), the turntable is spun at a low speed and additional coating solution is dispensed onto the substrate.

16 Claims, 2 Drawing Sheets

METHOD FOR COATING A SUBSTRATE WITH A COATING SOLUTION

This application is a continuation of prior application Ser. No. 08/693.468, filed Aug. 2, 1996 now abandoned.

BACKGROUND OF THE INVENTION

The present invention relates, in general, to processes for manufacturing electronic components and, more particularly, to applying a coating solution to a substrate.

Generally, manufacturing processes for electronic components include steps in which a substrate is coated with coating solutions such as cleaning solvents, adhesion promoters, photoresist, etc. In the manufacture of semiconductor devices, a semiconductor wafer is secured to a turntable and the coating solution is dispensed onto a central portion of the semiconductor wafer. Then, the turntable is operated to distribute or spread the coating solution over the semiconductor wafer surface.

When coating a semiconductor wafer with photoresist, it is desirable for the photoresist to uniformly coat the entire semiconductor wafer surface. To ensure a uniform coating, a large quantity of photoresist is initially dispensed onto a central portion of the semiconductor wafer surface and spread across the surface. The large quantity of photoresist increases the overall cost of manufacturing a semiconductor device because of the high cost of the photoresist. As those skilled in the art are aware, the cost of photoresist typically exceeds $150.00 per liter, thus the additional photoresist significantly increases the cost of manufacturing semiconductor devices.

Another technique for coating a semiconductor wafer with photoresist includes pre-wetting the surface of the semiconductor wafer with a solvent and then dispensing the photoresist. This technique requires a coating apparatus having a photoresist dispenser and a solvent dispenser. Thus, this technique requires modifying the coating apparatus to include an additional liquid dispenser. Although this technique reduces the amount of photoresist used for manufacturing a semiconductor device compared to non-pre-wetting techniques, it requires the use of an additional solvent, which adds to the manufacturing costs.

Accordingly, it would be advantageous to have a method for applying a coating solution to a substrate that reduces the amount of coating solution used. It would be of further advantage for the method to be suitable for use in existing coating equipment.

DETAILED DESCRIPTION OF THE DRAWINGS

Figure 1:
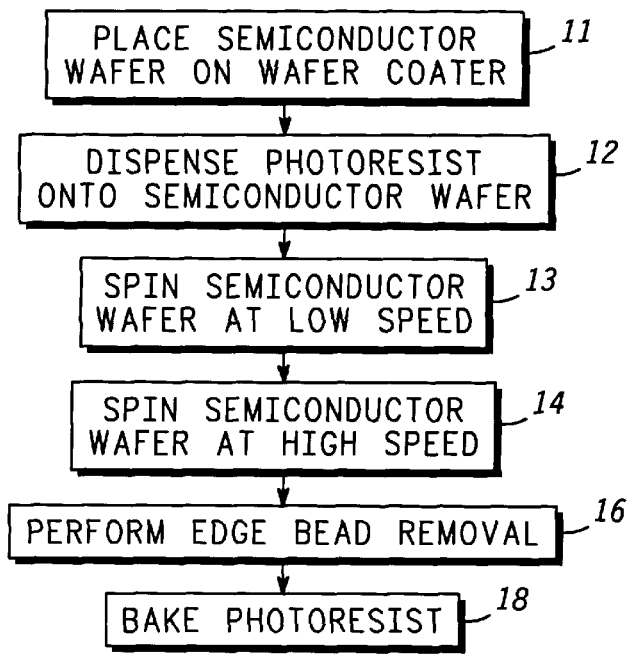
FIG. 1 is a flow chart of a prior art method for coating a semiconductor substrate with photoresist.

FIG. 1 is a flow chart 10 of a prior art method for coating a semiconductor substrate with photoresist. In accordance with the prior art method of FIG. 1, a semiconductor wafer is placed on a turntable or wafer chuck in a photoresist dispense apparatus, commonly referred to as a wafer coater (indicated by box 11). It should be noted that since semiconductor wafers and wafer coating apparatus are well known in the art, they are not shown in FIG. 1. A desired amount of photoresist is dispensed onto the surface of the semiconductor wafer (indicated by box 12). The amount of photoresist must be sufficient to coat the entire surface, and typically ranges between three and five cubic centimeters. The photoresist is initially distributed over the surface of the semiconductor wafer by spinning the turntable, and therefore the semiconductor wafer, at a low speed, e.g., 2,000 revolutions per minute (r.p.m.) as indicated by box 13 in FIG. 1. The low speed, also referred to as a precasting speed, serves to distribute the photoresist across the surface of the semiconductor wafer. Then, the thickness and uniformity of the layer of photoresist are adjusted by spinning the semiconductor wafer at a high speed, e.g., 3,500 r.p.m. (indicated by box 14). The high speed spin is also referred to as a casting speed. After the semiconductor wafer has been coated with photoresist, it undergoes a conventional edge bead removal process (indicated by box 16). The wafer is removed from the turntable and transferred to an oven for baking the photoresist layer in a conventional manner. Subsequently, the semiconductor wafer undergoes photolithographic processing. Photoresist dispense systems such as wafer coaters are well known to those skilled in the art.

Figure 2:
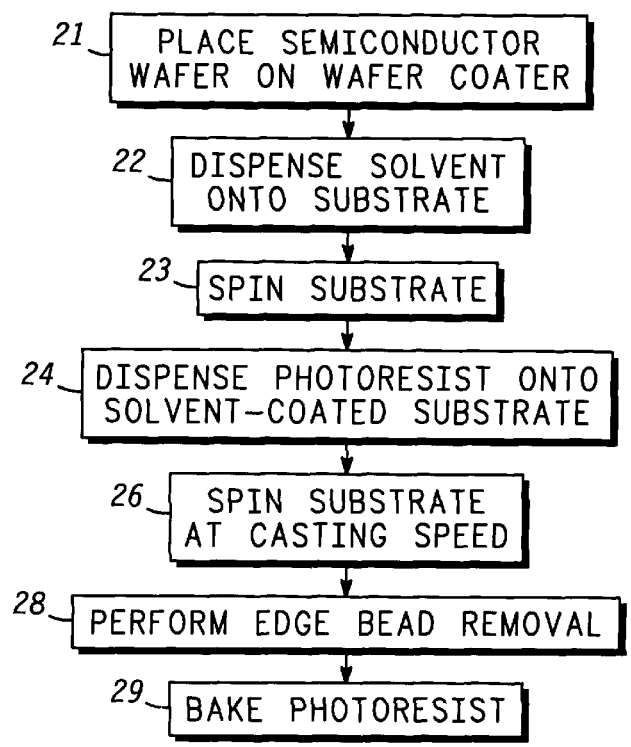
FIG. 2 is a flow diagram of another prior art method for coating a semiconductor substrate with photoresist.

FIG. 2 is a flow chart 20 of another prior art method for coating a semiconductor substrate with photoresist. In accordance with the prior art method of FIG. 2, a semiconductor wafer is placed on a turntable in a photoresist dispense apparatus having a photoresist dispenser and a solvent dispenser (indicated by box 21). It should be noted that since semiconductor wafers and wafer coating apparatus are well known in the art, they are not shown in FIG. 2. The liquid solvent dispenser is turned on to discharge the desired amount of solvent onto the surface of the semiconductor wafer (indicated by box 22). The turntable having the semiconductor wafer mounted thereto is spun at 4,000 r.p.m., thereby prewetting the surface of the semiconductor wafer and spinning off the majority of the solvent (indicated by box 23). The wafer chuck is slowed to a speed of 500 r.p.m. and the photoresist dispenser is turned on to discharge 3.5 cubic centimeters of liquid photoresist onto the liquid solvent film atop the semiconductor wafer. Then, the wafer is spun at 3,400 r.p.m. (indicated by box 26). After the semiconductor wafer has been coated with photoresist, it undergoes a conventional edge bead removal process (indicated by box 28). The wafer is removed from the turntable and transferred to an oven for baking the photoresist layer in the conventional manner (indicated by box 29). Subsequently, the semiconductor wafer undergoes photolithographic processing.

It should be noted that photoresist is very sensitive to the type and amount of solvent which is applied in the step indicated by box 22. Mixing the solvent with the photoresist may change the photolithographic properties of the photoresist, thereby lowering process yields. Further, the evaporative properties of the solvent must be such that the solvent does not completely evaporate prior to coating by the photoresist. In other words, a layer of wet solvent must remain on the wafer prior to dispensing the solvent. Thus, pre-wetting the surface with a solvent increases the processing complexity because factors such as time, temperature, humidity, etc. must be monitored to ensure the solvent doesn't evaporate before applying the photoresist.

Figure 3:
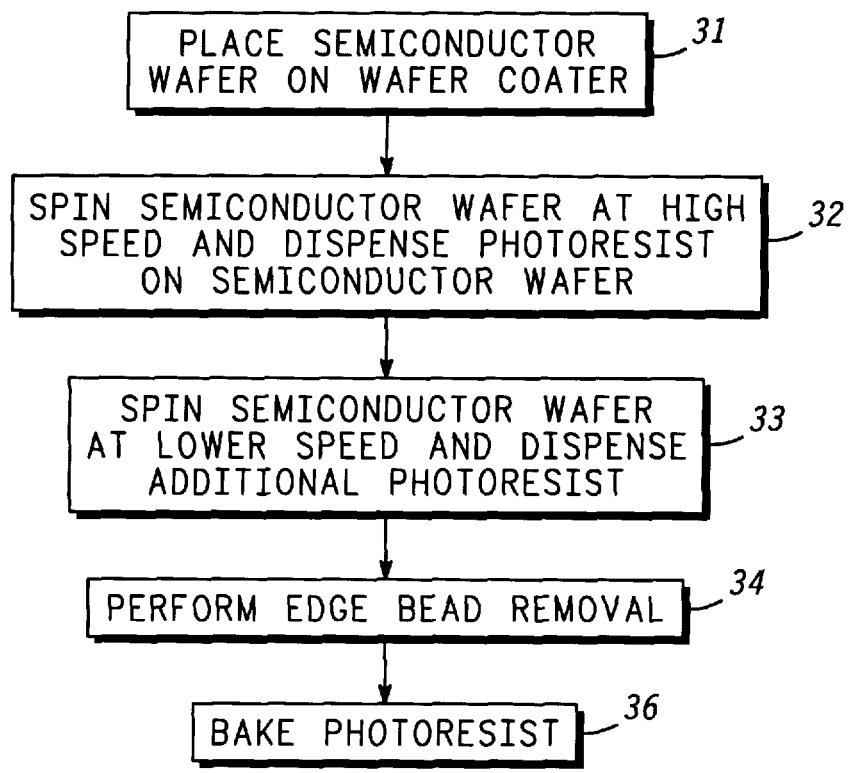
FIG. 3 is a flow chart of a method for dispensing photoresist in accordance with the present invention.

FIG. 3 is a flow chart 30 of a method for coating a substrate using a spin coating technique in accordance with the present invention. In a first step (indicated by box 31), a semiconductor wafer is placed on a turntable in a photoresist dispense apparatus. It should be noted that since semiconductor wafers and wafer coating apparatus are well known in the art, they are not shown in FIG. 3. The turntable having the semiconductor wafer mounted thereto is spun at a high speed and a small volume of photoresist is dispensed or discharged onto the surface of the semiconductor substrate (indicated by box 32). The high speed spin overcomes the surface tension of the semiconductor wafer to distribute the photoresist over the surface of the semiconductor wafer, thereby pre-wetting the surface. By way of example, the semiconductor wafer is a 200 millimeter (8 inch) silicon wafer, the high speed ranges between approximately 4,000 and 7,000 r.p.m., and the photoresist has a viscosity ranging between approximately 11 and 80 centipoise (cp) and a volume of less than approximately 1.5 cubic centimeters. Preferably, the high speed spin is 6,000 r.p.m., the viscosity of the photoresist is 40 centipoise, and the volume of the photoresist is less than approximately 1.5 cubic centimeters and is preferably 1 cubic centimeter. It should be understood that the order of dispensing and distributing the photoresist is not a limitation of the present invention. In other words, the photoresist may be dispensed prior to spinning the turntable at the high speed.

After less than approximately one second, the spin speed of the turntable having the semiconductor wafer mounted thereto is lowered to a speed ranging between approximately 1,000 r.p.m. and 3,500 r.p.m. and an additional volume of photoresist is dispensed onto the pre-wetted surface of the semiconductor substrate (indicated by box 33). In accordance with the example of the semiconductor wafer being a 200 millimeter wafer, the spin speed is approximately 2,000 r.p.m. and the additional volume of photoresist is less than approximately 1.5 cubic centimeters and is preferably 1 cubic centimeter. Thus, substantially equal amounts of photoresist are dispensed in both dispense steps. In accordance with this embodiment, at most a total volume of 2.5 cubic centimeters of photoresist is used to coat the semiconductor wafer. After the semiconductor wafer has been coated with photoresist, it undergoes a conventional edge bead removal process (indicated by box 34). The wafer is removed from the turntable and transferred to an oven for baking the photoresist layer in the conventional manner (indicated by box 36). Subsequently, the semiconductor wafer undergoes photolithographic processing.

Although the spin speeds and photoresist viscosities and volumes described hereinbefore have been optimized for 200 millimeter wafers, the method can be adapted for wafers having other sizes, e.g., 100 millimeter (4 inch), 150 millimeter (6 inch), etc., without undue experimentation. In addition, the present invention is not limited to dispensing the photoresist over the center of the wafer. In other words, the photoresist dispenser may be nonstationary such that it traverses the surface of the wafer while dispensing photoresist. For example, the photoresist dispenser can dispense the photoresist across the wafer starting at the center of the wafer and extending radially to a desired non-central portion of the surface.

By now it should be appreciated that a method for coating a substrate such as a semiconductor wafer with a coating solution such as photoresist has been provided. In accordance with the present invention, the coating of the semiconductor wafer is performed using a two-step process. In the first step, a small amount of photoresist is used to pre-wet the surface of the semiconductor wafer. An advantage of using photoresist as the pre-wetting agent is that the coating equipment does not have to be modified to have two dispensers. Another advantage is that having less parts requires less maintenance and clean up of the coating system, thereby allowing more uptime for the wafer coating system. In the second step, additional coating solution is applied to the pre-wetted surface of the substrate. For example, a small amount of photoresist is used to uniformly coat the semiconductor wafer and to provide the desired thickness of photoresist. Thus, the additional coating solution is spread over the pre-wetted surface of the substrate. In accordance with the present invention, only two cubic centimeters of photoresist are used to coat the semiconductor wafer, whereas the prior art techniques use at least three cubic centimeters of photoresist. In addition, the use of photoresist precludes the difficulties encountered when pre-wetting the wafer surface with a solvent. Using photoresist at both dispense steps maintains the integrity and consistency of the photoresist, and decreases processing complexities. In addition, the twostep process of the present invention, decreases the total volume of the photoresist used per semiconductor wafer, thereby decreasing the cost of manufacturing semiconductor devices.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, the coating solution may include positive and negative photoresists, paint, and dielectric materials. Similarly, the substrate may include semiconductor substrates such as gallium arsenide, silicon germanium, or the like. Other suitable substrates include ceramics, plastics, flat panels, or the like.

We claim:

1. A method for coating a substrate with a coating solution, comprising the steps of:

pre-wetting a surface of the substrate with the coating solution to form a pre-wetted surface, wherein a first amount of the coating solution is used to pre-wet the surface;

applying a second amount of coating solution to the pre-wetted surface of the substrate, wherein the second amount is substantially equal to the first amount; and spreading the additional coating solution over the prewetted surface of the substrate.

2. The method of claim 1, wherein the step of pre-wetting includes dispensing less than approximately 1.5 cubic centimeter of photoresist over the surface of the substrate.

3. The method of claim 1, wherein the steps of pre-wetting and applying additional coating solution include using a spin coating technique.

4. The method of claim 3, wherein using the spin coating technique includes pre-wetting the surface using a spin speed that is greater than a spinning speed for spreading the additional coating solution.

5. The method of claim 3, further including using the spin speed for spreading for pre-wetting the surface that is between approximately 4,000 and 7,000 revolutions per minute and using the spinning speed for spreading the additional coating solution that is between approximately 1,000 and approximately 3,500 revolutions per minute.

6. The method of claim 1, wherein the steps of pre-wetting and applying additional coating solution include using photoresist as the coating solution.

7. In an integrated circuit fabrication process, a method for applying photoresist to a surface of a semiconductor wafer, comprising the steps of:

applying photoresist to the surface of the semiconductor wafer;

spreading the photoresist substantially uniformly over the surface of the semiconductor wafer;

applying additional photoresist over the surface of the semiconductor wafer; and spreading the additional photoresist over the surface of the semiconductor wafer.

8. The method of claim 7, wherein the steps of spreading the photoresist and spreading the additional photoresist includes spinning the semiconductor wafer at first and second speeds, respectively, wherein the first speed is greater than the second speed.

9. The method of claim 7, wherein the steps of applying the photoresist and applying the additional photoresist include applying approximately equal amounts of photoresist.

10. The method of claim 7, wherein the step of spreading the photoresist includes spinning the semiconductor wafer at a speed ranging between approximately 4,000 and approximately 7,000 revolutions per minute.

11. The method of claim 7, wherein the step of spreading the additional photoresist includes spinning the semiconductor wafer at a speed ranging between approximately 1,000 and approximately 3,500 revolutions per minute.

12. The method of claim 7, wherein the step of applying photoresist includes dispensing less than 1.5 cubic centimeters of photoresist onto the semiconductor wafer and the step of applying additional photoresist includes dispensing less than 1.5 cubic centimeters of photoresist onto the semiconductor wafer.

13. A method for applying a coating solution to a surface of a substrate, comprising the steps of:

positioning the substrate on a turntable, wherein the surface of the substrate faces away from the turntable;

discharging a first volume of the coating solution onto the surface of the substrate;

spinning the substrate to distribute the coating solution over the surface of the substrate to form a pre-wetted substrate surface;

discharging a second volume of the coating solution on the pre-wetted substrate surface, wherein the step of discharging the second volume of the coating solution is separate from and temporally spaced apart from the step of discharging the first volume of the coating solution; and spinning the substrate to distribute the additional coating solution over the pre-wetted substrate surface.

14. The method of claim 13, wherein the step of spinning the substrate to distribute the coating solution includes spinning the substrate at a speed between approximately 4,000 revolutions per minute and approximately 7,000 revolutions per minute.

15. The method of claim 13, wherein the step of spinning the substrate to distribute the additional coating solution includes spinning the substrate at a speed between approximately 1,000 revolutions per minute and approximately 3,500 revolutions per minute.

16. The method of claim 13, wherein the steps of discharging a coating solution and discharging additional coating solution includes discharging photoresist.

* * * * *